United States Patent
Bhattacharya et al.

(10) Patent No.: US 7,430,100 B2
(45) Date of Patent: Sep. 30, 2008

(54) BUFFER CIRCUIT WITH ENHANCED OVERVOLTAGE PROTECTION

(75) Inventors: Dipankar Bhattacharya, Macungie, PA (US); Makeshwar Kothandaraman, Whitehall, PA (US); John C. Kriz, Palmerton, PA (US); Bernard L. Morris, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 32 days.

(21) Appl. No.: 11/169,139

(22) Filed: Jun. 28, 2005

(65) Prior Publication Data

US 2007/0019348 A1 Jan. 25, 2007

(51) Int. Cl.
*H02H 3/20* (2006.01)
(52) U.S. Cl. ........................... 361/91.1; 326/81
(58) Field of Classification Search ................ 361/91.1, 361/88; 326/80, 81, 83, 86
See application file for complete search history.

(56) References Cited

U.S. PATENT DOCUMENTS

| | | | | |
|---|---|---|---|---|
| 5,416,368 A | * | 5/1995 | Sugibayashi | 326/68 |
| 5,629,542 A | * | 5/1997 | Sakamoto et al. | 257/328 |
| 5,880,605 A | * | 3/1999 | McManus | 326/86 |
| 6,031,393 A | * | 2/2000 | Wayner | 326/81 |
| 6,064,231 A | * | 5/2000 | Kothandaraman et al. | 326/83 |
| 7,098,694 B2 | * | 8/2006 | Bhattacharya et al. | 326/81 |

FOREIGN PATENT DOCUMENTS

JP         05343977 A  * 12/1993

OTHER PUBLICATIONS

Uezono, Yukinori, Level Conversion Circuit, Dec. 24, 1993, Fujitsu LSD, Abstract, p. 1.*

* cited by examiner

*Primary Examiner*—Michael J Sherry
*Assistant Examiner*—Nicholas Ieva
(74) *Attorney, Agent, or Firm*—Ryan, Mason & Lewis, LLP

(57) ABSTRACT

A buffer circuit having enhanced overvoltage protection includes core buffer circuitry couplable to a first voltage source having a first voltage level. The core buffer circuitry is configured to receive a first signal and to generate a second signal which is a function of the first signal. The buffer circuit further includes a protection circuit coupled between the core buffer circuitry and a signal pad. The protection circuit is operative: (i) to clamp the first signal to about the first voltage level when a third signal received at the signal pad exceeds the first voltage level by a first amount; and (ii) to generate the first signal being substantially equal to the third signal when the third signal is less than or substantially equal to the first voltage level.

14 Claims, 3 Drawing Sheets

BUFFER CIRCUIT WITH ENHANCED OVERVOLTAGE PROTECTION

FIELD OF THE INVENTION

The present invention relates generally to electronic circuits, and more particularly relates to buffer circuits with overvoltage protection.

BACKGROUND OF THE INVENTION

Buffer circuits (e.g., output buffers, input buffers and bidirectional buffers) are employed in a variety of electronic devices and applications. In certain applications, a buffer circuit may be subjected to a voltage potential that is substantially higher than that which is supported by the specific process technology used to fabricate the buffer circuit. For example, a buffer circuit fabricated using a 3.3 volt (V) process may be subjected to a 5.0V input signal. In order to avoid over-stressing the devices in the buffer circuit, an N-channel metal-oxide-semiconductor (NMOS) protection device, M5, gated by a supply voltage VDD of the buffer circuit 100, may be placed in series between an input pad (PAD) 102 and the remainder 104 of the buffer circuitry, as shown in FIG. 1. The inclusion of the NMOS device, however, significantly restricts an input voltage swing of the buffer circuit, which slows down the buffer speed, particularly at lower supply voltages (e.g., about 2.0V). Additionally, the NMOS device limits the minimum VDD range under which the buffer circuit will properly function to less than about two volts.

Adding a series NMOS protection device between the input pad 102 and the remainder of the buffer circuitry can also cause the buffer circuit to consume significant direct current (DC) power, for example when an input signal applied to the buffer circuit is a logic high level. Specifically, when a logic high signal is applied to the input pad 102 of the buffer circuit 100, which is connected to a first terminal (e.g., drain) of the NMOS device M5, a second terminal (e.g., source) of the device at node N2 will be about a threshold voltage (Vtn) below the supply voltage, or VDD-Vtn. Consequently, a P-channel metal-oxide semiconductor (PMOS) transistor device (e.g., M1) in a first stage of the buffer circuit 100 connected to the series protection device M5 at node N2, may not completely turn off, thereby creating a DC path between VDD and ground. Moreover, if the first stage of the buffer circuit, including NMOS device M2 and PMOS device M1, incorporates a low pass filter therein, as is often required in certain applications, a delay through the filter would vary as a function of the incoming bit patterns applied to the buffer circuit, which is undesirable. While it is known to add a PMOS transistor device in parallel with the NMOS device M5 in order to reduce DC power consumption in the buffer circuit when a logic high input signal is applied, this PMOS device is only weakly turned on, and therefore such approach does not improve the speed of the buffer circuit.

Accordingly, there exists a need for an improved buffer circuit that provides protection against overvoltage stress, and yet does not suffer from one or more of the problems exhibited by conventional buffer circuits.

SUMMARY OF THE INVENTION

The present invention meets the above-noted need by providing, in an illustrative embodiment, an improved buffer circuit having overvoltage protection without significantly reducing a speed and/or input voltage swing of the buffer circuit. Additionally, the improved buffer circuit is configured to have reduced DC power consumption during an overvoltage condition of the buffer circuit.

In accordance with one aspect of the invention, a buffer circuit having enhanced overvoltage protection includes core buffer circuitry couplable to a first voltage source having a first voltage level. The core buffer circuitry is configured to receive a first signal and to generate a second signal which is a function of the first signal. The buffer circuit further includes a protection circuit coupled between the core buffer circuitry and a signal pad. The protection circuit is operative: (i) to clamp the first signal to about the first voltage level when a third signal received at the signal pad exceeds the first voltage level by a first amount; and (ii) to generate the first signal being substantially equal to the third signal when the third signal is less than or substantially equal to the first voltage level.

The protection circuit, in one embodiment of the invention, preferably includes at least one complementary pass gate including a first transistor of a first polarity type and a second transistor of a second polarity type connected in parallel with the first transistor, the first transistor being biased to the first voltage level. The protection circuit further includes a bias circuit for biasing the second transistor. The bias circuit is selectively operable in one of at least two modes as a function of a voltage level of the third signal, wherein in a first mode the bias circuit is operative to turn on the second transistor, and in a second mode the bias circuit is operative to turn off the second transistor.

In accordance with another aspect of the invention, an integrated circuit includes at least one buffer circuit having enhanced overvoltage protection, the buffer circuit including core buffer circuitry couplable to a first voltage source having a first voltage level. The core buffer circuitry is configured to receive a first signal and to generate a second signal which is a function of the first signal. The at least one buffer circuit further includes a protection circuit coupled between the core buffer circuitry and a signal pad. The protection circuit is operative: (i) to clamp the first signal to about the first voltage level when a third signal received at the signal pad exceeds the first voltage level by a first amount; and (ii) to generate the first signal being substantially equal to the third signal when the third signal is less than or substantially equal to the first voltage level.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative buffer circuits. It should be understood, however, that the present invention is not limited to these or any other particular circuit arrangements. Rather, the invention is more generally applicable to techniques for providing overvoltage protection to a buffer circuit, without significantly reducing a speed and/or input voltage swing of the buffer circuit. Although implementations of the present invention are described herein with specific reference to PMOS and NMOS transistor devices, as may be formed using a CMOS fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Figure 1:
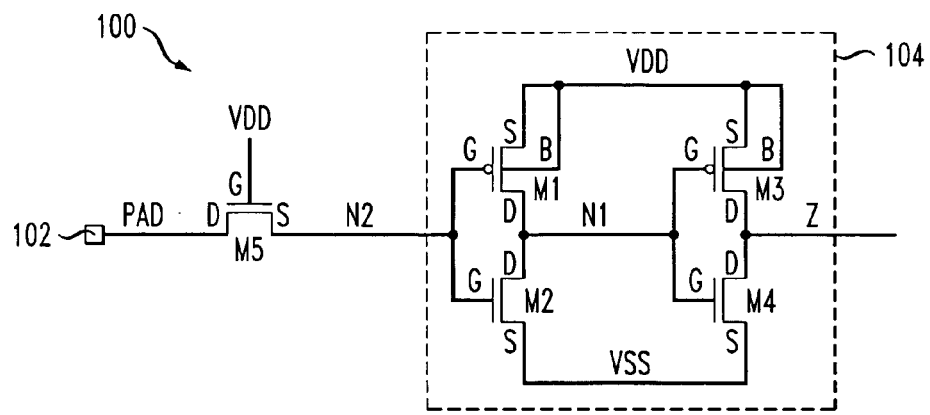
FIG. 1 is a schematic diagram illustrating a conventional complementary metal-oxide-semiconductor (CMOS) digital buffer circuit employing a series NMOS protection device.

FIG. 1 is a schematic diagram illustrating a conventional CMOS digital buffer circuit 100 employing a series NMOS protection device, M5, coupled to core buffer circuitry 104. The core buffer circuitry 104 includes an input stage comprising PMOS device M1 and NMOS device M2 connected together as a standard inverter, and an output stage comprising PMOS device M3 and NMOS device M4 connected together as a standard inverter. Specifically, a source (S) of device M1 is connected to supply voltage VDD, gates (G) of devices M1 and M2 are connected to a source of protection device M5 at node N2, drains (D) of M1 and M2 are connected together and form an output of the input stage at node N1, and a source of M2 is connected to VSS, which may be ground. Gates of devices M3 and M4 are connected to node N1, a source of M3 is connected to VDD, drains of M3 and M4 are connected together and form an output, Z, of the buffer circuit 100, and a source of M4 is connected to VSS. A drain of the protection device M5 is connected to an input pad (PAD) 102, and a gate of M5 is connected to VDD.

The NMOS protection device M5 functions as a source-follower voltage clamp, preventing a voltage at node N2 from exceeding VDD-Vtn, where Vtn is an N-channel threshold voltage. For instance, if 5V is applied to the input pad 102, and VDD is equal to 3.3V, the voltage at node N2 will be 3.3V-Vtn, or about 2.7V, regardless of the voltage appearing on the pad, since the value of Vtn is generally about 0.6V. Under these conditions, no transistor device in the buffer circuit 100 receives more than 3.3V at its gate or across its source-to-drain connections.

The buffer circuit 100 has several drawbacks, however, under "normal" operation, for example, when the voltage at the input pad 102 does not exceed VDD. First, in a high state, such as when the voltage applied to the input pad 102 is equal to VDD, node N2 remains clamped at VDD-Vtn, and therefore the signal presented to the input stage of the buffer circuit 100 is not a rail-to-rail signal. This can cause the PMOS device M1 in the input stage of the core buffer circuitry 104 to not completely turn off, thereby allowing DC power to be consumed in the buffer circuit 100. Second, preventing node N2 from going all the way up to VDD can significantly reduce the speed of the buffer circuit, particularly at lower values of VDD (e.g., VDD=3.3V). Even worse, at sufficiently low values of VDD, such as, for example, when VDD is about 2.0V or less, and/or at certain integrated circuit (IC) process conditions (e.g., high threshold voltage), the buffer circuit may not switch at all. A practical example of this problem is often encountered in attempting to meet secure digital input/output (SDIO) and/or multimedia card (MMC) specifications, which require that the buffer circuit be 5V tolerant at a VDD of 3.3V, while requiring the same buffer circuit to function properly at VDD as low as 1.65V (although not necessarily 5V tolerant at this low VDD level).

Figure 2:
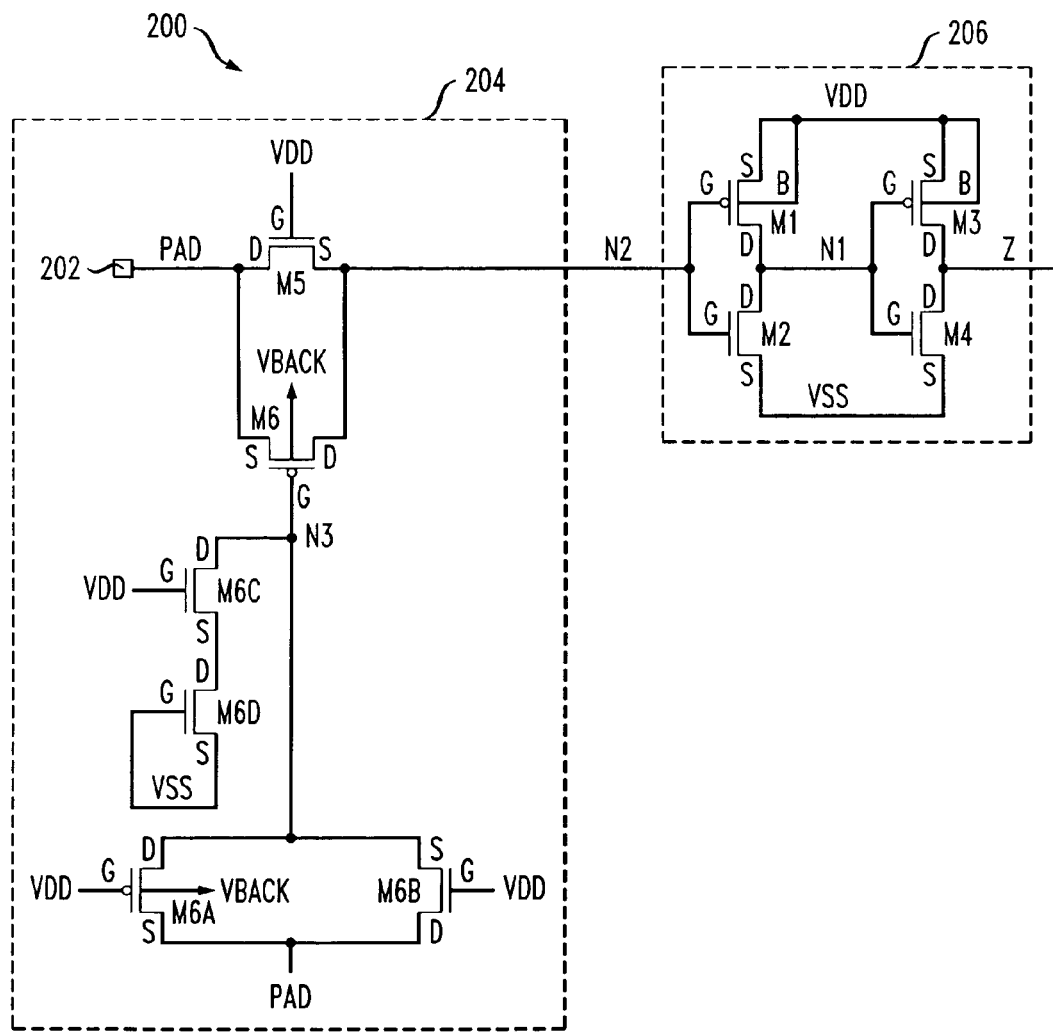
FIG. 2 is a schematic diagram illustrating a digital buffer circuit employing an improved series protection circuit in which the techniques of the present invention may be implemented.

FIG. 2 is a schematic diagram depicting an exemplary buffer circuit 200 including a protection circuit 204 connected in series between an input pad 202, or alternative signal pad, and core buffer circuitry 206. The core buffer circuitry 206 may comprise, for example, a first inverter including a PMOS transistor device M1 and an NMOS transistor device M2 connected in a standard inverter configuration, with a source of M1 connecting to a first voltage source, preferably VDD, and a source of M2 connecting to a second voltage source, preferably VSS. Gates of devices M1 and M2 are connected together and form an input of the core buffer circuitry 206, which is connected to the protection circuit 204 at node N2. Drains of devices M1 and M2 are connected together and form an output of the first inverter at node N1. Core buffer circuitry 206 further comprises a second inverter including a PMOS transistor device M3 and an NMOS transistor device M4 connected in a standard inverter configuration, with a source of M3 connecting to VDD, and a source of M4 connecting to VSS. Gates of devices M3 and M4 are connected together and form an input of the second inverter, which is connected to the output of the first inverter at node N1. Drains of devices M3 and M4 are connected together and form an output, Z, of the core buffer circuitry 206. It is to be understood that the present invention is not limited to the core buffer circuitry shown, but rather alternative buffer circuit arrangements are similarly contemplated by the invention.

It is to be appreciated that, because a metal-oxide-semiconductor (MOS) device is symmetrical in nature, and thus bidirectional, the assignment of source and drain designations in the MOS device is essentially arbitrary. Therefore, the source and drain of a given device may be referred to herein generally as first and second source/drains, respectively, where the term "source/drain" in this context denotes a source or a drain. Additionally, while the buffer circuit is shown as being connected to an input pad, in alternative buffer circuit configurations (e.g., output buffer circuit, bidirectional buffer circuit, etc.), the input pad may be used as an input, an output, or both, and therefore is referred to herein generally as a signal pad, as being more closely indicative of a function thereof.

Protection circuit 204 preferably comprises a complementary pass gate, also referred to as a transmission gate, including an NMOS transistor device M5 connected in parallel with a PMOS transistor device M6. Specifically, a drain of device M5 connects to input pad 202, a source of M5 is connected to the input of core buffer circuitry 206 at node N2, a gate of M5 connects to VDD, a source of device M6 is connected to the drain of M5, and a drain of M6 is connected to the source of M5. A gate of device M6 is preferably driven by a bias circuit at node N3 comprising a CMOS pass gate including a PMOS transistor device M6A connected in parallel with an NMOS transistor device M6B. Specifically, a drain of device M6A is preferably connected to a source of device M6B at node N3, a source of M6A connects to the input pad 202, a drain of M6B connects to the input pad, and gates of M6A and M6B connect to VDD. The pass gate in the bias circuit is preferably connected in series between the input pad 202 and node N3, which is the gate of device M6. Alternatively, device M6 may be driven by a bias circuit connected to node N3 which is external to the protection circuit 204. It is to be understood that the present invention is not limited to the particular protection circuit shown, but rather alternative protection circuit arrangements are similarly contemplated by the invention.

During normal operation of buffer circuit 200 (e.g., when a voltage at the input pad, Vpad, does not exceed VDD), device M6A is always turned off, since its gate is connected to VDD. When Vpad is substantially equal to VDD, device M6B acts as a source follower and sets node N3 equal to VDD-Vtn. NMOS transistors M6C and M6D may be added to provide a leakage path between node N3 and VSS, which helps to properly bias node N3. Devices M6C and M6D, when employed, are preferably connected in a stacked configuration, with a drain of M6C connected to node N3, a gate of M6C connected to VDD, a source of M6C connected to a drain of M6D, and a gate and source of M6D connected to VSS. Providing a leakage path between node N3 and VSS allows device M6 to turn on, albeit rather weakly. This in turn allows node N2 to swing up to VDD, thereby turning off device M1 and reducing DC power consumption in the buffer circuit 200.

During an overvoltage event, such as, for example, when Vpad is about a threshold voltage or more above VDD (e.g., when Vpad=5.0V and VDD=3.3V), device M6A will turn on. When M6A is turned on, the voltage on the pad 202 passes through to node N3, thereby turning off device M6. With device M6 turned off, the protection circuit 204 functions essentially like the series NMOS protection device M5 described herein above in conjunction with FIG. 1, for providing protection to node N2. While the exemplary buffer circuit 200 reduces DC power consumption in the high state, the buffer circuit does not adequately solve the speed problem, since the PMOS device M6 is only weakly turned on under normal operation of the buffer circuit.

Figure 3:
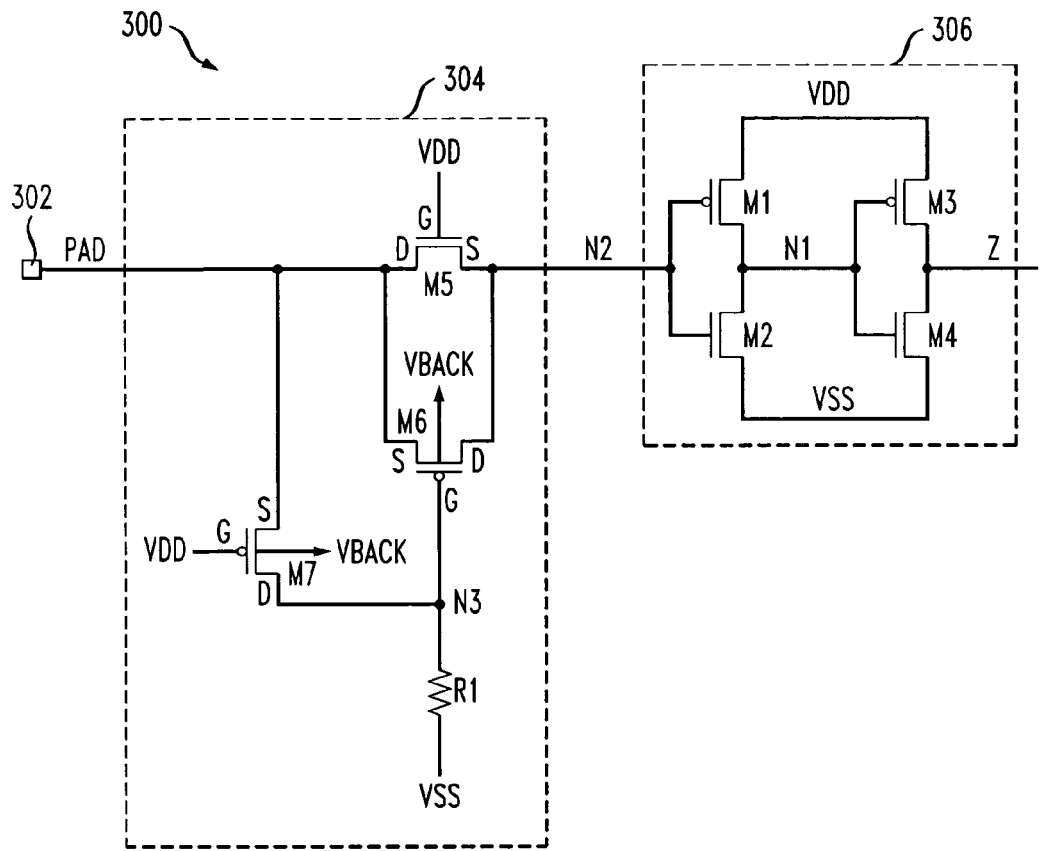
FIG. 3 is a schematic diagram illustrating an exemplary buffer circuit employing an improved series protection circuit, formed in accordance with one embodiment of the invention.

FIG. 3 is a schematic diagram depicting an exemplary buffer circuit 300, formed in accordance with one embodiment of the invention. The exemplary buffer circuit 300 includes a protection circuit 304, connected in series between an input pad 302 and core buffer circuitry 306, which is preferably identical to the core buffer circuitry 206 described above in conjunction with FIG. 2, although alternative core buffer circuitry arrangements are similarly contemplated. Like protection circuit 204 shown in FIG. 2, protection circuit 304 preferably comprises a CMOS pass gate comprising an NMOS transistor device M5 connected in parallel with a PMOS transistor device M6. Specifically, a drain of device M5 connects to input pad 302, a source of M5 is connected to an input of core buffer circuitry 306 at node N2, a source of device M6 is connected to the drain of M5, and a drain of M6 is connected to the source of M5. A gate of device M5 connects to VDD and a gate of device M6 preferably connects to VSS via a high impedance path. In one embodiment of the invention, the gate of device M6 is connected to a bias circuit at node N3 comprising a pull-down resistor, R1, or alternative resistive element (e.g., a long channel MOS device), coupled between node N3 and VSS. Resistor R1 is preferably of high resistance value (e.g., about 100 kilo (K) ohms) so as to minimize current consumption in the buffer circuit 300.

The bias circuit connected at node N3, which in this embodiment comprises resistor R1, is preferably configured to ensure that device M6 is turned on strongly under normal operation of the buffer circuit 300, such as, for example, when a voltage, Vpad, at pad 302 does not exceed VDD, or when Vpad is less than about a transistor threshold voltage above VDD. The protection circuit 304 may further include a PMOS transistor device M7 connected between the pad 302 and the gate of device M6 at node N3. Specifically, a source of device M7 preferably connects to the pad 302, a drain of M7 is connected to node N3, and a gate of M7 connects to VDD. When an overvoltage condition occurs at the input pad 302, such as, for example, when Vpad is greater than about a P-channel threshold voltage (Vtp) above VDD, device M7 turns on. Device M7 turning on causes Vpad to also be applied to node N3, thereby turning off device M6 and protecting the remainder of the buffer circuit 300 from excess voltage.

With reference to FIGS. 1 and 2, some of the PMOS devices in the buffer circuit, such as devices M1 and M3, have bulk (B) terminals implicitly connected to VDD. However, as shown in FIG. 3, any PMOS devices that are connected to a node that may exceed VDD, such as input pad 302, cannot have their bulk terminals connected to VDD, or else a parasitic diode that is inherent in the PMOS transistor structure itself can turn on, resulting in a latch-up condition. Consequently, any PMOS devices having a terminal connecting to pad 302, such as devices M6 and M7 in protection circuit 304, preferably have their bulk terminals connecting to a third voltage source, VBACK, having a potential selected to prevent turning on the parasitic diodes associated with these devices. In a preferred embodiment of the invention, the third voltage source VBACK is a function of Vpad, such that VBACK is selected to be the higher of VDD or Vpad.

Figure 4:
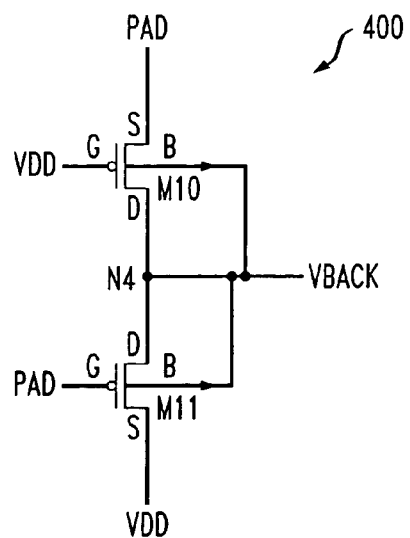
FIG. 4 is a schematic diagram depicting an exemplary voltage generator circuit suitable for use in the illustrative buffer circuit shown in FIG. 3.

FIG. 4 is a schematic diagram illustrating an exemplary voltage generator circuit 400 for generating the voltage VBACK which can be employed for biasing the bulk terminals of devices M6 and M7 in the buffer circuit 300 shown in FIG. 3, in accordance with one embodiment of the invention. It is to be understood that the present invention is not limited to the particular voltage generator circuit arrangement shown. The voltage generator circuit 400 preferably comprises a pair of PMOS transistor devices, M10 and M11, connected in series in a cross-coupled gate configuration. Specifically, a gate of device M10 preferably connects to VDD and a source of M10 connects to pad 302, while a gate of device M11 connects to pad 302 and a source of M11 connects to VDD. Drains and bulk terminals of devices M10 and M11 are connected together at node N4, which generates the voltage VBACK.

When Vpad is less than VDD, device M11 is turned on and device M10 is turned off, thereby setting VBACK substantially equal to VDD. Likewise, when Vpad is greater than VDD, such as when Vpad=5.0V and VDD=3.3V, device M11 is turned off and device M10 is turned on, thereby setting VBACK substantially equal to Vpad. Thus, the voltage generator circuit 400 is operative to generate a voltage VBACK which is the greater of Vpad or VDD. When Vpad is equal to VDD, devices M10 and M11 will be turned off, thereby causing VBACK to float. In practice, however, having VBACK float does not create any adverse problems.

One disadvantage with the buffer circuit 300 depicted in FIG. 3 is that resistor R1 must be sufficiently conductive (e.g., low impedance) so as to hold node N3 low against a capacitive coupling which tends to pull node N3 high when the input pad 302 goes high. However, when there is an overvoltage condition present in the buffer circuit 300, there will be a leakage current which flows from pad 302 to VSS through device M7 and resistor R1. Thus, the objective of trying to hold node N3 low while minimizing current consumption in the buffer circuit places a significant limit on how conductive resistor R1 can be made.

Figure 5:
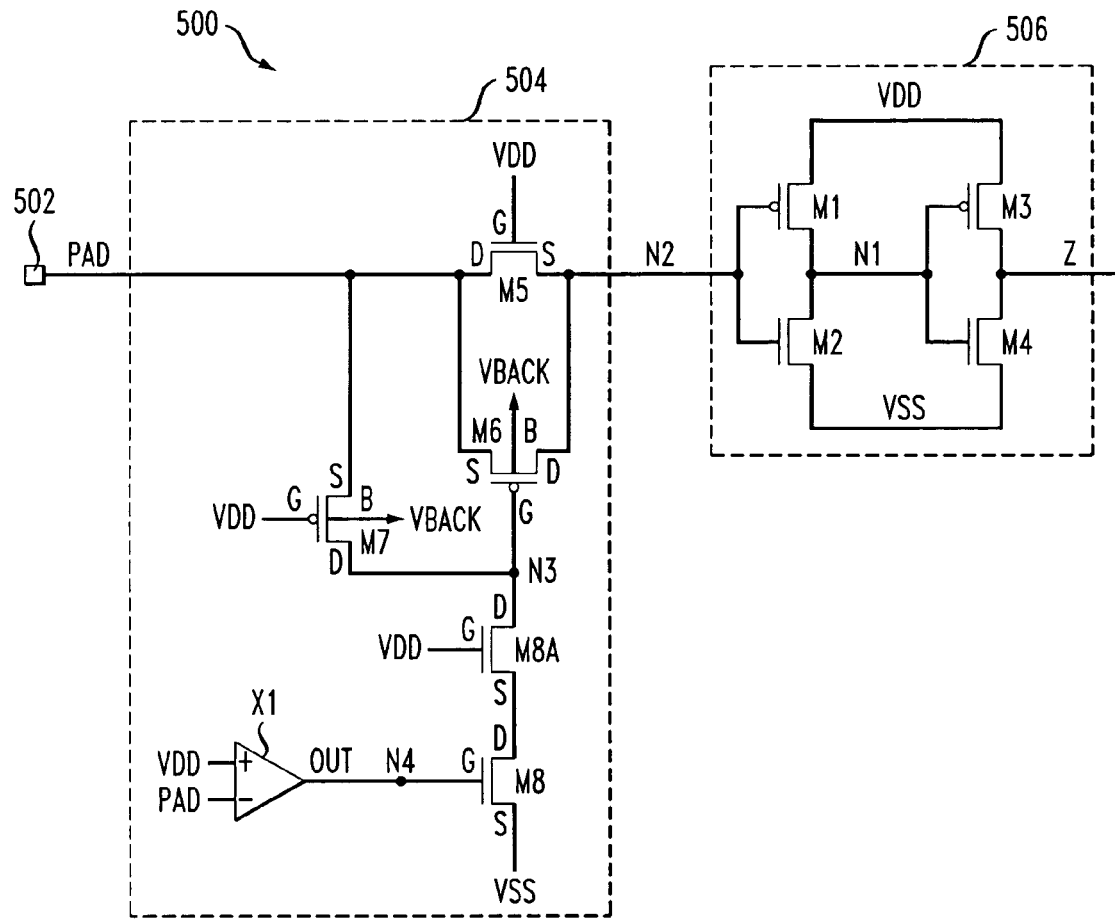
FIG. 5 is a schematic diagram illustrating an exemplary buffer circuit employing an improved series protection circuit, formed in accordance with a second embodiment of the invention.

FIG. 5 is a schematic diagram depicting an exemplary buffer circuit 500, formed in accordance with another embodiment of the invention. Exemplary buffer circuit 500 preferably comprises a protection circuit 504, connected in series between an input pad 502 and core buffer circuitry 506, which, although not required, may be the same as the core buffer circuitry 306 in the illustrative buffer circuit 300 shown in FIG. 3. Protection circuit 504, like the protection circuit 304 depicted in FIG. 3, preferably comprises a CMOS pass gate including an NMOS transistor device M5, which is gated by VDD, connected in parallel with a PMOS transistor device M6. Protection circuit 504 further includes a PMOS transistor device M7 connected between input pad 502 and a gate of device M6 at node N3. Device M7 is provided for turning off device M6 during an overvoltage condition, so as to reduce DC power consumption in the buffer circuit 500. Bulk terminals of any PMOS devices that are connected to a node that can exceed VDD, such as devices M6 and M7, are preferably connected to the voltage source VBACK. The voltage generator circuit 400, shown in FIG. 4 and described above, may be employed in conjunction with buffer circuit 500 for providing the voltage VBACK, although alternative voltage generator circuits are similarly contemplated by the invention.

In comparison to the protection circuit 304 shown in FIG. 3, protection circuit 504 is preferably modified by replacing resistor R1 with a switched NMOS transistor device M8. Device M8 is preferably protected from excess voltage by at least one NMOS transistor device M8A connected in series between the gate of device M6 and device M8. Specifically, a drain of device M8A is preferably connected to the gate of device M6 at node N3, a source of M8A is connected to a drain of device M8, a gate of M8A connects to VDD, and a source of M8 connects to VSS. Device M8 is preferably controlled by a comparator X1 connected to a gate of M8 at node N4.

The comparator X1 preferably generates a control signal, OUT, which is operative to control an impedance of an electrical path between the gate of device M6 at node N3 and VSS by selectively turning device M8 on or off as a function of a voltage appearing at input pad 502, namely, Vpad, and VDD. As previously stated, the impedance of the electrical path between node N3 and VSS is preferably low enough to ensure that node N3 is held low against a capacitive coupling that tends to pull node N3 high when Vpad goes high. Moreover, when there is an overvoltage condition present in the buffer circuit 500, such as, for example, when Vpad exceeds VDD, the impedance of this electrical path is preferably high enough so as to minimize the leakage current flowing from pad 502 to VSS through devices M7, M8A and M8.

In accordance with one aspect of the invention, the comparator X1 preferably receives VDD at a first input, which may be a non-inverting (+) input, and Vpad at a second input, which may be an inverting (−) input, and generates the control signal OUT. The signal OUT is preferably high when Vpad is below VDD, which may be defined as a normal operation of buffer circuit 500, and is preferably low when Vpad is greater than VDD, which is preferably indicative of an overvoltage condition. When OUT is high, device M8 is turned on, which strongly pulls node N3 low, allowing device M6 to be turned strongly on. During an overvoltage condition, Vpad exceeds VDD. This turns on device M7, thereby setting node N3 substantially equal to Vpad and turning off device M6. At the same time, OUT is low, thereby turning off device M8 and reducing DC power consumption in the buffer circuit 500. Node N2 will be clamped to a maximum voltage of VDD-Vtn, where, as previously stated, Vtn is an N-channel device threshold voltage, thereby protecting devices M1 and M2 from excessive voltages.

Figure 6:
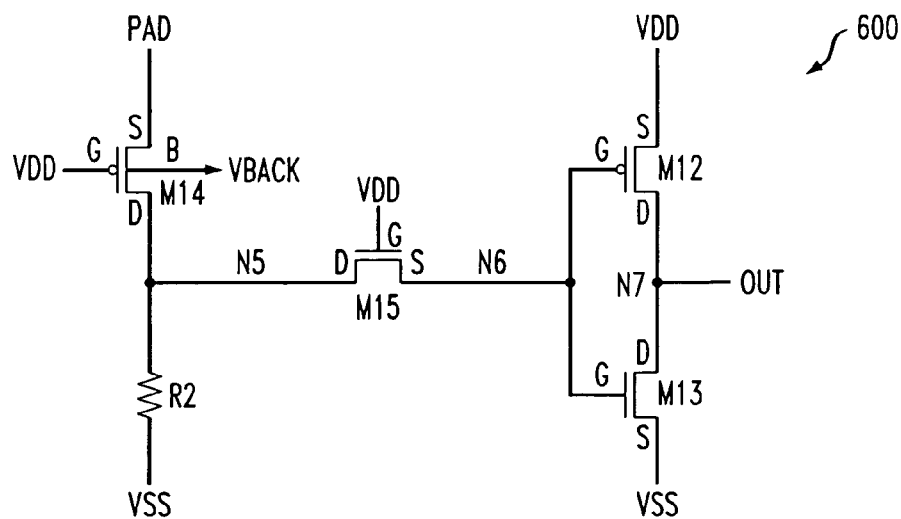
FIG. 6 is a schematic diagram depicting an exemplary comparator circuit suitable for use in the illustrative buffer circuit shown in FIG. 5.

Most comparators have a disadvantage of consuming at least some DC power during normal operation. An exemplary comparator 600 which does not consume any significant DC power during normal operation of the buffer circuit 500 (e.g., when Vpad does not exceed VDD) is shown in FIG. 6. Comparator 600 preferably comprises a first stage including PMOS transistor device M14 having a source connecting to the input pad 502 (see FIG. 5), a gate connecting to VDD, a drain connected to a first terminal of a resistor R2, or an alternative resistive element, at node N5, and a bulk terminal connecting to VBACK. A second terminal of resistor R2 preferably connects to VSS. The combination of device M14 and resistor R2 is similar to the combination of device M7 and resistor R1 in the buffer circuit 500 shown in FIG. 5, although the corresponding components need not be matched to one another. The value of resistor R2 in comparator 600 can be made substantially large, such as, for example, greater than 100K ohms. Making the value of resistor R2 substantially large reduces an input current through device M14 and R2 when Vpad exceeds VDD, without compromising the ability of device M6 in the buffer circuit 500 of FIG. 5 to remain strongly turned on when Vpad is not greater than VDD.

An output of the first stage of comparator 600 at node N5 is fed to an input of an inverter at node N6, preferably via a series NMOS pass transistor device M15 which is gated by VDD. Device M15, when employed, functions primarily to protect the inverter connected to node N6 from overvoltages when Vpad exceeds VDD, in a manner similar to NMOS protection device M5 depicted in FIG. 1. The inverter, which forms a second stage of the comparator 600, preferably comprises a PMOS transistor M12 and an NMOS transistor M13 connected in a standard inverter configuration. Specifically, a source of device M12 preferably connects to VDD, gates of devices M12 and M13 are connected to node N6, drains of M2 and M13 are connected together and form an output of the comparator 600 at node N7, and a source of M13 connects to VSS.

It is to be understood that, for any of the various buffer circuit embodiments described herein, one or more of the transistor gates that are shown as being directly connected to VDD or the input pad may similarly be connected to these nodes through an appropriate series resistor, or alternative resistance element (e.g., MOS device). This approach is often employed to improve electrostatic discharge (ESD) robustness. Moreover, in order to provide additional overvoltage protection to core buffer circuitry in a given buffer circuit when a difference between the voltage on the input pad of the buffer circuit is greater than a transistor threshold voltage above VDD, the present invention contemplates that more than one transmission gate, or alternative protection device, may be employed in the respective protection circuit of the buffer circuit, as will become apparent to those skilled in the art.

At least a portion of the buffer circuits of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A buffer circuit having overvoltage protection, comprising:
   core buffer circuitry couplable to a first voltage source having a first voltage level, the core buffer circuitry being configured to receive a first signal and to generate a second signal which is a function of the first signal; and
   a protection circuit coupled between the core buffer circuitry and a signal pad, the protection circuit being operative: (i) to clamp the first signal to about the first voltage level and to interrupt a current path between the signal pad and a current return of the protection circuit when a third signal received at the signal pad exceeds the first voltage level by a first amount; and (ii) to generate the first signal being substantially equal to the third signal when the third signal is less than or substantially equal to the first voltage level;
   wherein the protection circuit comprises:
   at least one complementary pass gate including a first transistor of a first polarity type and a second transistor of a second polarity type connected in parallel with the first transistor, the first transistor being biased to the first voltage level; and
   a bias circuit for biasing the second transistor, the bias circuit being selectively operable in one of at least two modes as a function of a voltage level of the third signal, wherein in a first mode the bias circuit is operative to turn on the second transistor, and in a second mode the bias circuit is operative to turn off the second transistor;
   wherein the bias circuit comprises:
   a PMOS transistor device including a first source/drain connecting to the signal pad, a second source/drain connected to the second transistor, a gate connecting to the first voltage source, and a bulk terminal connecting to a second voltage source having a second voltage level;
   at least a first NMOS transistor device including a first source/drain coupled to the second transistor, a second source/drain connecting to the current return of the protection circuit, and a gate for receiving a control signal, the control signal enabling the first NMOS device in the first mode and disabling the first NMOS device in the second mode; and
   a comparator operative to generate the control signal as a function of a difference between a voltage level of the third signal and the first voltage level.

2. The circuit of claim 1, wherein the first amount is substantially equal to a threshold voltage of a metal-oxide-semiconductor transistor device.

3. The circuit of claim 1, wherein the first transistor in the complementary pass gate comprises an NMOS transistor device including a first source/drain connecting to the signal pad, a second source/drain connected to an input of the core buffer circuitry, and a gate connecting to the first voltage source; and the second transistor in the complementary pass gate comprises a first PMOS transistor device including a first source/drain connecting to the signal pad, a second source/drain connected to the input of the core buffer circuitry, a bulk terminal connected to the second voltage source, and a gate.

4. The circuit of claim 3, wherein the bias circuit is operative to turn on the first PMOS transistor device when the a voltage level of the third signal is less than about a threshold voltage above the first voltage level, and to turn off the first PMOS transistor when the voltage level of the third signal exceeds about the first voltage level.

5. The circuit of claim 1, wherein the second voltage source is operative such that the second voltage level is substantially equal to a greater of the first voltage level and a voltage level of the third signal.

6. The circuit of claim 1, wherein the second voltage source comprises second and third PMOS transistor devices, a first source/drain of the second PMOS device and a gate of the third PMOS device connecting to the signal pad, a gate of the second PMOS device and a first source/drain of the third PMOS device connecting to the first voltage source, and a second source/drain of the second PMOS device, a second source/drain of the third PMOS device and bulk terminals of the second and third PMOS devices being connected together and generating the second voltage level.

7. The circuit of claim 1, wherein the bias circuit further comprises a second NMOS transistor device connected between the first NMOS device and the second transistor in the at least one complementary pass gate, the second NMOS device including a first source/drain connected to the second transistor, a second source/drain connected to the first source/drain of the first NMOS device, and a gate connecting to the first voltage source.

8. The circuit of claim 1, wherein the comparator in the bias circuit comprises:
   a second PMOS transistor device having a first source/drain connecting to the signal pad, a gate connecting to the first voltage source, a bulk terminal connecting to the second voltage source, and a second source/drain connected to the current return of the protection circuit via a series resistive element; and
   an inverter having an input coupled to the second source/drain of the second PMOS device and an output for generating the control signal, the control signal being indicative of a difference between a voltage level of the third signal and the first voltage level.

9. The circuit of claim 8, wherein the bias circuit further comprises a second NMOS transistor device including a first source/drain connected to the second source/drain of the second PMOS device, a second source/drain connected to the input of the inverter, and a gate connecting to the first voltage source.

10. The circuit of claim 1, wherein the core buffer circuitry comprises first and second inverters, an input of the first inverter being connected to the protection circuit, an output of the first inverter being connected to an input of the second inverter, and an output of the second inverter forming an output of the buffer circuit.

11. An integrated circuit including at least one buffer circuit having overvoltage protection, the at least one buffer circuit comprising:
   core buffer circuitry couplable to a first voltage source having a first voltage level, the core buffer circuitry being configured to receive a first signal and to generate a second signal which is a function of the first signal; and
   a protection circuit coupled between the core buffer circuitry and a signal pad, the protection circuit being operative: (i) to clamp the first signal to about the first voltage level and to interrupt a current path between the signal pad and a current return of the protection circuit when a third signal received at the signal pad exceeds the first voltage level by a first amount; and (ii) to generate the first signal being substantially equal to the third signal when the third signal is less than or substantially equal to the first voltage level;

wherein the protection circuit comprises:

at least one complementary pass gate including a first transistor of a first polarity type and a second transistor of a second polarity type connected in parallel with the first transistor, the first transistor being biased to the first voltage level; and a bias circuit for biasing the second transistor, the bias circuit being selectively operable in one of at least two modes as a function of a voltage level of the third signal, wherein in a first mode the bias circuit is operative to turn on the second transistor, and in a second mode the bias circuit is operative to turn off the second transistor;

wherein the bias circuit comprises:

a PMOS transistor device including a first source/drain connecting to the signal pad, a second source/drain connected to the second transistor, a gate connecting to the first voltage source, and a bulk terminal connecting to a second voltage source having a second voltage level;

at least a first NMOS transistor device including a first source/drain coupled to the second transistor, a second source/drain connecting to the current return of the protection circuit, and a gate for receiving a control signal, the control signal enabling the first NMOS device in the first mode and disabling the first NMOS device in the second mode; and a comparator operative to generate the control signal as a function of a difference between a voltage level of the third signal and the first voltage level.

12. The integrated circuit of claim 11, wherein the first amount is substantially equal to a threshold voltage of a metal-oxide-semiconductor transistor device.

13. The integrated circuit of claim 11, wherein the first transistor in the complementary pass gate comprises an NMOS transistor device including a first source/drain connecting to the signal pad, a second source/drain connected to an input of the core buffer circuitry, and a gate connecting to the first voltage source; and the second transistor in the complementary pass gate comprises a first PMOS transistor device including a first source/drain connecting to the signal pad, a second source/drain connected to the input of the core buffer circuitry, a bulk terminal connected to the second voltage source, and a gate.

14. A buffer circuit having overvoltage protection, comprising:

core buffer circuitry couplable to a first voltage source having a first voltage level, the core buffer circuitry being configured to receive a first signal and to generate a second signal which is a function of the first signal; and a protection circuit coupled between the core buffer circuitry and a signal pad, the protection circuit being operative: (i) to clamp the first signal to about the first voltage level and to interrupt a current path between the signal pad and a current return of the protection circuit when a third signal received at the signal pad exceeds the first voltage level by a first amount; and (ii) to generate the first signal being substantially equal to the third signal when the third signal is less than or substantially equal to the first voltage level.

* * * * *